United States Patent [19]

Ishibashi

[11] Patent Number: 5,424,249
[45] Date of Patent: Jun. 13, 1995

[54] METHOD OF MAKING MOLD-PACKAGED PRESSURE SENSING SEMICONDUCTOR DEVICE

[75] Inventor: Kiyoshi Ishibashi, Itami, Japan

[73] Assignee: Mitsubishi Denki Kabushiki Kaisha, Tokyo, Japan

[21] Appl. No.: 167,485

[22] Filed: Dec. 15, 1993

Related U.S. Application Data

[62] Division of Ser. No. 881,797, May 12, 1992, abandoned.

[30] Foreign Application Priority Data

Jan. 23, 1992 [JP] Japan .................................. 4-10015

[51] Int. Cl.⁶ ............................................ H01L 21/56
[52] U.S. Cl. ..................................... 437/211; 437/209; 437/217; 437/219; 437/220; 437/974; 257/787
[58] Field of Search ................ 437/209, 211, 214, 215, 437/219, 974, 923, 217, 220; 257/787

[56] References Cited

U.S. PATENT DOCUMENTS

| | | | |
|---|---|---|---|
| 4,188,708 | 2/1980 | Frederiksen | 437/220 |
| 4,691,575 | 9/1987 | Sonderegger et al. | 73/756 |
| 4,823,605 | 4/1989 | Stein | 73/727 |
| 4,838,089 | 6/1989 | Okada et al. | 73/727 |
| 5,209,120 | 5/1993 | Araki | 73/727 |

FOREIGN PATENT DOCUMENTS

| | | | |
|---|---|---|---|
| 0163855 | 12/1980 | Japan | 437/217 |
| 0084448 | 5/1984 | Japan | 437/217 |
| 0183743 | 9/1985 | Japan | 437/220 |

*Primary Examiner*—Olik Chaudhuri
*Assistant Examiner*—Long Pham
*Attorney, Agent, or Firm*—Oblon, Spivak, McClelland, Maier, & Neustadt

[57] ABSTRACT

A pressure sensor element (50) is bonded to a die bonding pad (4). The pressure sensor element (50) is thereafter entirely covered with epoxy resin (11) and completely packaged. Following this, the epoxy resin (11) is locally removed at a portion above a diaphragm (5) of the pressure sensor element (50). As a result, the diaphragm (5) is exposed. In this method, the diaphragm (5) is uncovered without using a special metallic mold which prohibits the epoxy resin (11) from flowing into a space above the diaphragm (5). A gold wire (8) is also molded by the package sealing. Thus, a resulting package-molded pressure sensing semiconductor device is highly reliable under adverse environmental conditions and considerably cost-effective.

18 Claims, 6 Drawing Sheets

METHOD OF MAKING MOLD-PACKAGED PRESSURE SENSING SEMICONDUCTOR DEVICE

This is a division of application Ser. No. 07/881,797, filed on May 12, 1992, now abandoned.

BACKGROUND OF THE INVENTION

1. Field of the Invention

The present invention relates to a pressure sensing semiconductor device which is package sealed by molding resin material. The present invention also relates to a method of manufacturing such a mold-packaged pressure sensing semiconductor device.

2. Description of the Background Art

As a package for package sealing a pressure sensing semiconductor device, a metal package and a hollow resin package, which is formed by molding resin, are in wide use in the semiconductor industry, the reason being that the metal packages have an excellent endurance against environmental disturbances and the hollow resin packages are cost-effective although less reliable under adverse environmental conditions. The hollow resin packages are employed on the premise that a pressure sensor of a semiconductor device operates under relatively clean measuring conditions in detecting atmospheric and other pressures. Thus, behind the popular use of the hollow resin packages are their cheapness which weighs more importance than the device reliability to environmental disturbances. Still, small wonder that the weakness in the device reliability does remain as a problem, especially in connection with thin bonding wires, typically gold and aluminium, which connect an internal element (i.e., a sensor element) and external leads being unmolded.

Some seek a solution not in the hollow resin packages but in the mold packages, a package which is popular in the IC industry. While the mold packages promise an increased reliability of the bonding wires, molding technique needs to be improved because a pressure receiving part for detecting pressure, generally referred to as a silicon diaphragm, must be left unmolded. To prevent molding resin from flowing into the silicon diaphragm, special packaging considerations are necessary in determining the configuration of a metallic mold and the structure of the sensor element.

For all the improvement in package sealing, a mold-packaged semiconductor device for detecting pressure is faced with a number of difficulties. For instance, the very improvement adversely affects the design simplicity of the metallic mold. Equally problematic, since the pressure receiving surface of the sensor element is extremely small, to perfectly inhibit molding resin flow into the pressure receiving surface is almost impossible. These difficulties have been discouraging use of mold-packaged pressure sensing semiconductor devices. Mold-packaged pressure sensing semiconductor devices which are relatively reliable under hard environmental conditions and extremely cheap to fabricate are yet to be seen.

SUMMARY OF THE INVENTION

A mold-packaged pressure sensing semiconductor device according to an aspect of the present invention comprises a pressure sensor element having a diaphragm, and a molding resin package sealing the pressure sensor element, the molding resin package having a window through which the diaphragm is exposed.

Preferably, the pressure sensor element comprises a "PYREX" glass block and a pressure sensor chip fixed on the "PYREX" glass block.

Preferably, the molding resin package is formed of epoxy resin.

Thus, in the semiconductor device of the present invention, the molding resin package seals the pressure sensor element entirely except at the window through which the diaphragm is exposed. Hence, accurate transmission of pressure to the diaphragm and device reliability under adverse environmental conditions are ensured.

The present invention also relates to a method of manufacturing a mold-packaged pressure sensing semiconductor device. The method comprises the steps of (a) preparing a pressure sensor element which has a diaphragm, (b) fully covering the pressure sensor element with a molding resin so that the pressure sensor element is entirely package sealed, and (c) removing the molding resin at a portion above the diaphragm, thereby forming a window through which the diaphragm is exposed.

In a first aspect of the method, the step (b) includes the steps of (b-1) preparing a metallic mold which has a cavity, (b-2) setting the pressure sensor element to the cavity of the metallic mold, (b-3) implanting the molding resin into the cavity, thereby sealing the pressure sensor element, and (b-4) taking out the pressure sensor element now package sealed from the cavity of the metallic mold.

In a first aspect of the method, it is further preferred in the step (b-3) that the molding resin is implanted into the cavity under such an implantation pressure that the diaphragm is not destroyed by the implantation pressure of the molding resin.

In a second aspect, the method further comprises the steps of (d) preparing a lead and (e) wire bonding the pressure sensor element and the lead with a bonding wire. The bonding wire is preferably sealed with the molding resin in the step (b).

In a third aspect of the method, the step (c) includes the steps of (c-1) mechanically removing the portion of the molding resin above the diaphragm halfway so that the diaphragm remains still covered with the molding resin, and (c-2) completely removing the molding resin remaining above the diaphragm by a chemical method, thereby forming a window through which the diaphragm is exposed.

In the third aspect, the step (c-1) preferably includes the step of (c-1-1) injecting abrasives on the molding resin at the portion above the diaphragm. Still preferably, the molding resin is polished by a sand blasting method.

In the third aspect, the step (c-1) alternatively includes the step of (c-1-1) chipping off the portion of the molding resin above the diaphragm. Still preferably, the molding resin is chipped off using a grinder.

In the third aspect of the method, the step (c-2) preferably includes the step of (c-2-1) completely dissolving the molding resin at the portion above the diaphragm and exposing the diaphragm.

It is further preferred that the step (c-2-1) includes the steps of completely dissolving the molding resin at the portion above the diaphragm with a few drops of fuming nitride acid and exposing the diaphragm, thereafter cleaning the diaphragm in water, thereafter dehydrating the diaphragm, and thereafter drying the diaphragm. The diaphragm is preferably dehydrated using ethanol in the step of dehydrating.

In the third aspect of the method, the step (b) preferably includes the step of (b-1) package sealing the pressure sensor element in a manner that the molding resin has a thinner thickness at a portion above the diaphragm than at other portions.

In a fourth aspect of the method, the step (b-1) includes the steps of (b-1-1) preparing a metallic mold having a cavity defined by an inner surface having a projection which corresponds to the diaphragm, (b-1-2) setting the pressure sensor element to the cavity of the metallic mold so that the diaphragm is situated opposite the projection, (b-1-3) implanting the molding resin into the cavity and sealing the pressure sensor element, whereby the pressure sensor element as package-sealed has a recess at a portion occupied by the projection, and (b-1-4) thereafter taking out the pressure sensor element now package-sealed from the metallic mold.

In the step (b-1-3), the molding resin is preferably implanted into the cavity under such an implantation pressure that the diaphragm is not destroyed by the implantation pressure of the molding resin.

In the fourth aspect of the method, the step (c) includes the step of (c-1) chemically removing the molding resin still remaining at a bottom of the recess and exposing the diaphragm. The step (c-1) preferably includes the step of (c-1-1) dissolving and removing molding resin still remaining at a bottom of the recess.

It is still further preferred that the step (c-1-1) includes the steps of dissolving the molding resin remaining at the bottom of the recess with a few drops of fuming nitride acid and exposing the diaphragm, thereafter cleaning the diaphragm in water, thereafter dehydrating the diaphragm, and thereafter drying the diaphragm.

In the fourth aspect of the method, the diaphragm is preferably dehydrated using ethanol.

Thus, the manufacturing method of the present invention includes the steps of entirely package sealing the pressure sensor element with the molding resin, and locally removing the molding resin above the diaphragm and forming the window through which the diaphragm is exposed. Hence, it is not necessary to design the metallic mold minutely so as to prevent the molding resin from flowing into the diaphragm. Improvement in the structure of the pressure sensor element is required, neither. This simplifies the manufacturing process and reduces the manufacturing costs.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
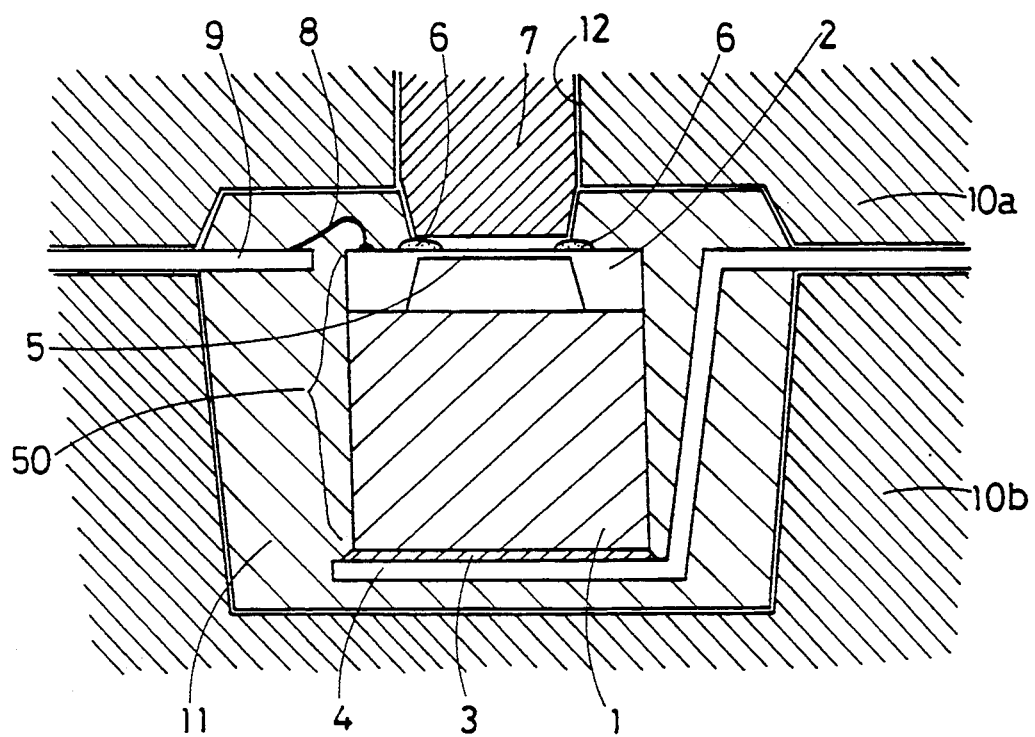
FIG. 1 is a cross sectional view of a mold-packaged pressure sensing semiconductor device according to a first preferred embodiment of the present invention.

FIG. 1 is a cross sectional view showing a resin molding process of a mold-packaged pressure sensing semiconductor device according to a first preferred embodiment of the present invention. In FIG. 1, a pressure sensor chip 2 is mounted on a glass block 1 made of the "PYREX" glass, thereby forming a pressure sensor element 50. The "PYREX" glass block 1 is bonded to a die bonding pad 4 by a die bonding resin 3. A dam resin 6 is provided on the pressure sensor chip 2 so as to be aligned over the periphery of a diaphragm 5 of the pressure sensor chip 2. The dam resin 6 is pushed against the pressure sensor chip 2 by a pressure pin 7 which is inserted in a hole 12 punched through an upper metallic mold (or a cope) 10a. The pressure sensor chip 2 is connected to a leadframe 9 by a gold wire 8. As shown in FIG. 1, the whole structure is packaged by transferring an epoxy resin 11 into the upper metallic mold 10a and a lower metallic mold (or a drag) 10b assembled as one metallic mold. Blocked by the dam resin 6 formed above the periphery of the diaphragm 5, the epoxy resin 11 is never allowed to flow into a space above the diaphragm 5. Thus, the mold-packaged pressure sensing semiconductor device includes a window only at the pressure receiving part.

However, the manufacturing method as above has a problem; the diaphragm 5, which is very thin and hence fragile, may possibly be damaged by pressure of the pressure pin 7. Further, accurate alignment of the dam resin 6 to the periphery of the diaphragm 5 is difficult to achieve since the diaphragm 5 is extremely small.

Figure 2:
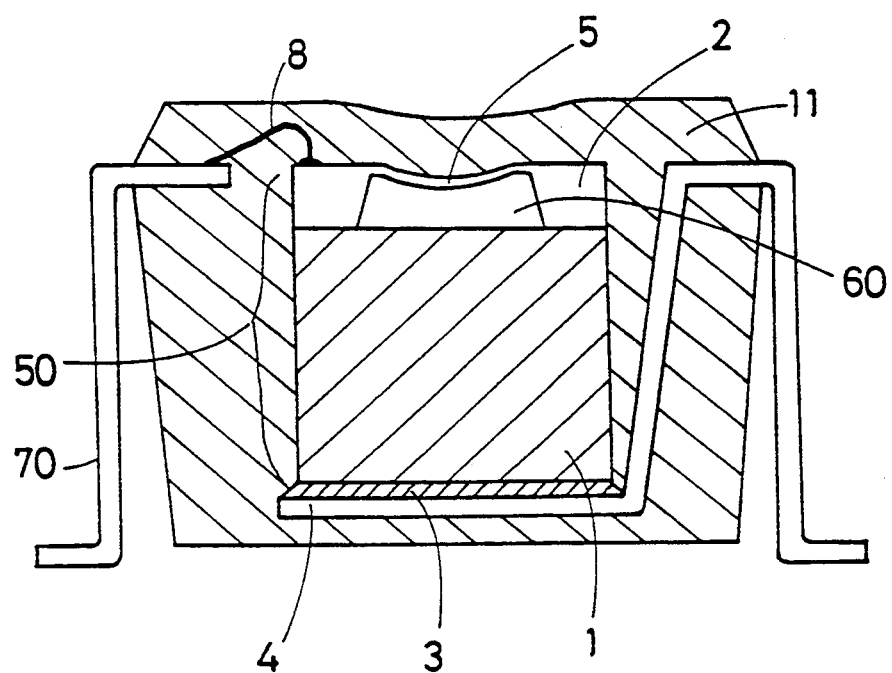
FIGS. 2 to 4 are cross sectional views of a mold-packaged pressure sensing semiconductor device according to a second preferred embodiment of the present invention.
Figure 3:
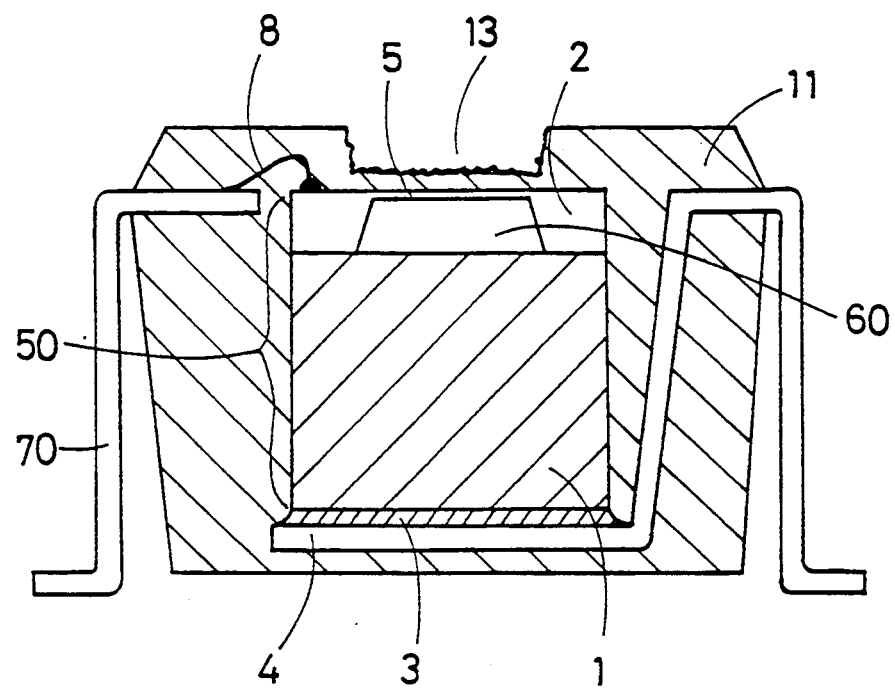
Figure 4:
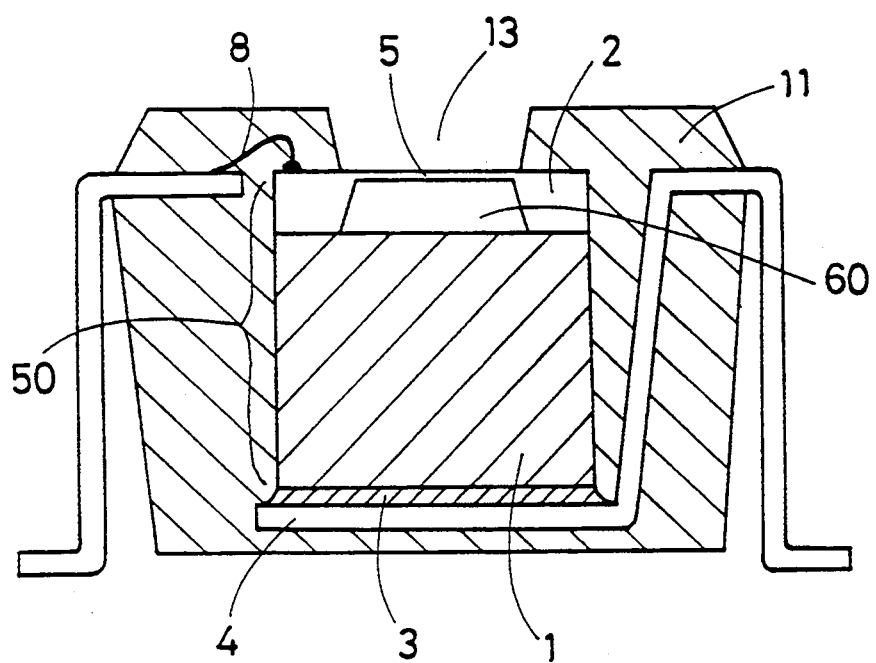

A mold-packaged pressure sensing semiconductor device which is free from the difficulties above is herewith disclosed. FIGS. 2 to 4 are cross sectional views showing process steps of manufacturing a mold-packaged pressure sensing semiconductor device according to a second preferred embodiment of the present invention. The process sequence starts with bonding a pressure sensor element 50 to the die bonding pad 4 of a leadframe by a die bonding resin 3, the leadframe being iron-nickel alloy and around 0.25 mm in thickness. The pressure sensor element 50 is formed by anode coupling a pressure sensor chip 2 and a glass block 1 made of the "PYREX" glass so as to include a vacuum cavity 60 which serves as a reference pressure chamber. After being fixed to the die ponding pad 4, the pressure sensor element 50 is wire bonded to an inner lead 70 of the leadframe with a gold wire 8.

Next, the pressure sensor element 50 is entirely resin sealed by an epoxy resin 11 in a conventional manner (FIG. 2). That is, as commonly practiced in fabricating ICs, setting the leadframe now mounting the pressure sensor element 50 to a metallic mold and thereafter pouring the epoxy resin 11 into the cavity of the metallic mold. The implantation pressure of the epoxy resin 11 must be adjusted not to destroy the diaphragm 5. Following this, the epoxy resin 11 is cured. The stress of the epoxy resin 11 desirably falls within a certain low range (super low stress resin) in which the diaphragm 5 is not destroyed by the stress of molding resin. At this stage, the epoxy resin 11 is transferred so that the pressure sensor element 50 is covered including at an area above the diaphragm 5. Detaching the upper metallic mold 10a and the lower metallic mold 10b, the pressure sensor element 50 is obtained which is entirely covered with the epoxy resin 11 on every surface including the area directly above the diaphragm 5. Since the allover sealing makes pressure transmission to the diaphragm 5 impossible thereby depriving the pressure sensor element 50 of a pressure detecting function, a window is formed packaged-structure as described in the below.

First, the epoxy resin 11 is mechanically removed at the area above the diaphragm 5, in a diameter of around 1 to 2 mm and to a depth a certain distance off the diaphragm 5. As a method of this local removal of the epoxy resin 11, sand blasting (injecting abrasives onto molding resin and polishing the molding resin away) or grinding (grinding molding resin using a grinder) may be employed, the sand blasting and the grinding each being a common method to form a window in a plastic sealed IC for analysis of device characteristics. After roughly removing the epoxy resin 11 at the area above the diaphragm 5 as shown in FIG. 3 and forming a recess 13 at that area, remainders of the epoxy resin 11 in the bottom surface of the recess 13 are chemically dissolved with a few drops of fuming nitride acid. The method of dissolving the epoxy resin with the fuming nitride acid is also a known technique of forming a window in a plastic sealed IC for analysis therefor.

On exposing the surface of the diaphragm 5 by dissolving the epoxy resin 11, the packaged structure is washed in water to remove the fuming nitride acid. The packaged structure cleaned enough in water is then dehydrated with ethanol at the diaphragm 5. Drying the structure in an oven, a mold-packaged pressure sensing semiconductor device as shown in FIG. 4 is obtained. As shown in FIG. 4, with no epoxy resin 11 left on the diaphragm 5, pressure is accurately transmitted to the diaphragm 5, ensuring that the semiconductor device operates as a pressure sensing device.

Figure 5:
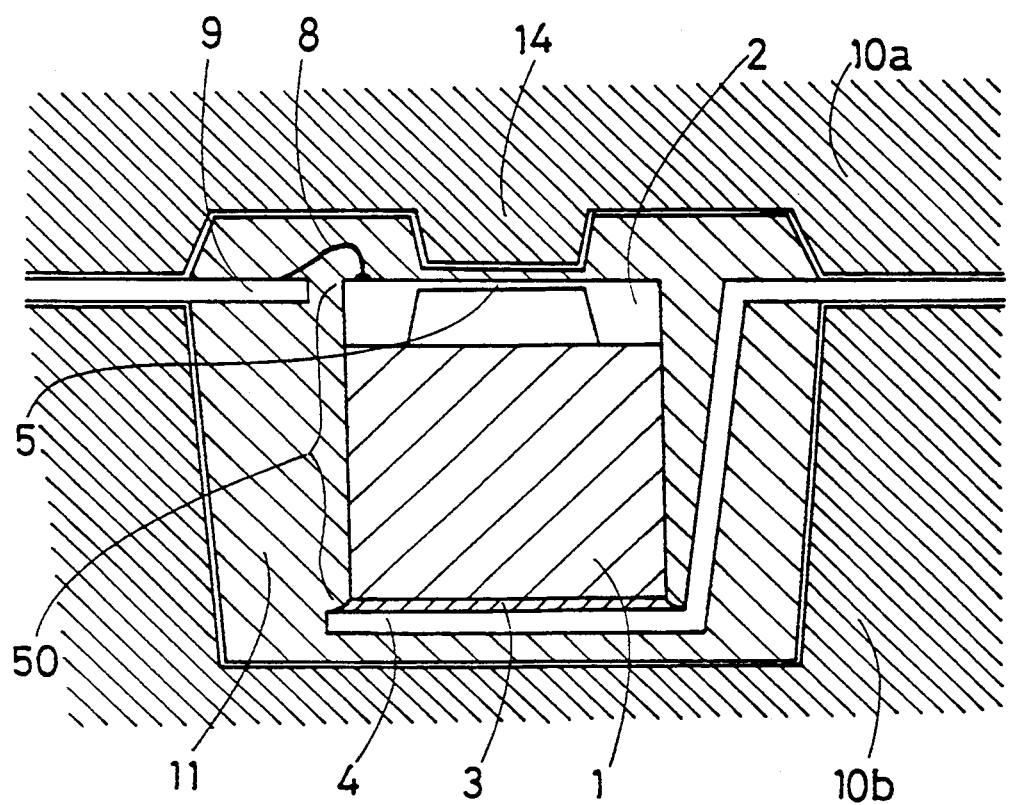
FIGS. 5 and 6 are cross sectional views of a mold-packaged pressure sensing semiconductor device according to a third preferred embodiment of the present invention.
Figure 6:
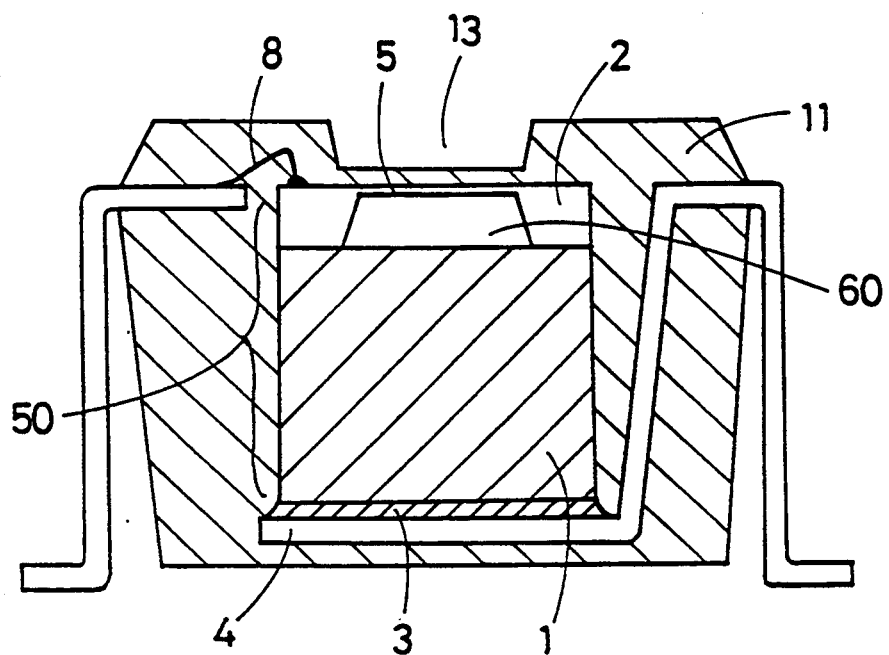

FIGS. 5 and 6 are cross sectional views showing process steps of manufacturing a mold-packaged pressure sensing semiconductor device according to a third preferred embodiment of the present invention. The mold-packaged pressure sensing semiconductor device of the third preferred embodiment is improved regarding the structure of a metallic mold which is formed by assembling an upper metallic mold 10a and a lower metallic mold 10b. More precisely, the upper metallic mold 10a includes a projection 14 to be opposite a diaphragm 5. A leadframe mounting a pressure sensor element 50 is set to the upper and the lower metallic molds 10a and 10b as combined as one in such a manner that the diaphragm 5 and the projection 14 are opposite each other. The epoxy resin 11 is thereafter transferred into the cavity of the metallic mold to thereby resin seal the pressure sensor element 50. A resulting structure includes a recess 13 in the epoxy resin 11 above the diaphragm 5 (FIG. 6). Thus, the resulting structure is equivalent to the structure of FIG. 3. Being formed by pouring resin into the metallic mold, the bottom surface of the recess 13 is more smooth than the bottom surface of the corresponding recess of FIG. 3. The remainders of the epoxy resin 11 in the recess 13 are then removed by chemical dissolution, similarly to the second preferred embodiment. The mold-packaged pressure sensing semiconductor device is thus complete which is equal in structure to the semiconductor device of FIG. 4.

In the third preferred embodiment (and the second preferred embodiment), even if the thickness of the epoxy resin 11 left on the diaphragm 5 after the local removal is not precisely as it is desired to be, the chemical removal step will not be adversely affected. Hence, extremely precise definition of the depth of the projection 14 formed in the upper metallic mold 10a is not needed. In other words, the upper metallic mold 10a is formed in an enough easy manner in which a conventional metallic mold is customarily formed.

Thus, the second and the third preferred embodiments do not require a metallic mold having minute design. Further, differently from the first preferred embodiment, the pressure sensor element 50 does not require any improvement such as accurate control of the pressure of the pressure pin 7 and precise alignment of the dam resin 6 to the periphery of the diaphragm 5. The second and the third preferred embodiments therefore have advantageous over the first preferred embodiment in terms of fabrication simplicity and overall costs.

The mold-packaged pressure sensing semiconductor devices herein disclosed are plastic sealed with the epoxy resin 11 except at the diaphragm 5. Hence, the pressure sensing semiconductor devices of the present invention are quite reliable under regular measuring conditions although less hermetic than metal packaged devices.

While the invention has been shown and described in detail, the foregoing description is in all aspects illustrative and not restrictive. It is understood that numerous modifications and variations can be devised without departing from the scope of the invention.

I claim:

1. A method of manufacturing a mold-packaged pressure sensing semiconductor device, the method comprising the steps of:
    (a) preparing a pressure sensor element which has a diaphragm;
    (b) fully covering said pressure sensor element with a molding resin so that said pressure sensor element is entirely package sealed; and
    (c) removing said molding resin at a portion above said diaphragm, thereby forming a window through which said diaphragm is exposed;
  wherein said step (c) includes the steps of:
    (c-1) mechanically removing said portion of said molding resin above said diaphragm halfway so that said diaphragm remains still covered with said molding resin; and
    (c-2) completely removing said molding resin remaining above said diaphragm by a chemical method, thereby forming a window through which said diaphragm is exposed.

2. A method of claim 1, wherein said step (b) includes the steps of:
    (b-1) preparing a metallic mold which has a cavity;
    (b-2) setting said pressure sensor element to said cavity of said metallic mold;
    (b-3) implanting said molding resin into said cavity, thereby sealing said pressure sensor element; and
    (b-4) taking out said pressure sensor element now package sealed from said cavity off said metallic mold.

3. A method of claim 2, wherein, in said step (b-3), said molding resin is implanted into said cavity under such an implantation pressure that said diaphragm is not destroyed by the implantation pressure of said molding resin.

4. A method of claim 1, further comprising the steps of:
    (d) preparing a lead; and
    (e) wire bonding said pressure sensor element and said lead with a bonding wire;

wherein said bonding wire is sealed with said molding resin in said step (b).

5. A method of claim 1, wherein said step (c-1) includes the step of
(c-1-1) injecting abrasives on said molding resin at said portion above said diaphragm.

6. A method of claim 5, wherein said step (c-1-1) includes the step of:
polishing away said molding resin by a sand blasting method.

7. A method of claim 1, wherein said step (c-1) includes the step of:
(c-1-1) chipping off said portion of said molding resin above said diaphragm.

8. A method of claim 7, wherein said step (c-1-1) includes the step of:
chipping off said molding resin using a grinder.

9. A method of claim 1, wherein said step (c-2) includes the step of:
(c-2-1) completely dissolving said molding resin at said portion above said diaphragm and exposing said diaphragm.

10. A method of claim 9, wherein said step (c-2-1) includes the steps of:
completely dissolving said molding resin at said portion above said diaphragm with a few drops of fuming nitride acid and exposing said diaphragm;
thereafter cleaning said diaphragm in water;
thereafter dehydrating said diaphragm; and
thereafter drying said diaphragm.

11. A method of claim 10, wherein said diaphragm is dehydrated using ethanol in said step of dehydrating.

12. A method of manufacturing a mold-packaged pressure sensing semiconductor device, the method comprising the steps of:
(a) preparing a pressure sensor element which has a diaphragm;
(b) fully covering said pressure sensor element with a molding resin so that said pressure sensor element is entirely package sealed; and
(c) removing said molding resin at a portion above said diaphragm, thereby forming a window through which said diaphragm is exposed;
wherein said step (b) includes the step of:
(b-1) package sealing said pressure sensor element in a manner that said molding resin has a thinner thickness at a portion above said diaphragm than at other portions.

13. A method of claim 12, wherein said step (b-1) includes the steps of:
(b-1-1) preparing a metallic mold having a cavity defined by an inner surface having a projection which corresponds to said diaphragm;
(b-1-2) setting said pressure sensor element to said cavity of said metallic mold so that said diaphragm is situated opposite said projection;
(b-1-3) implanting said molding resin into said cavity and sealing said pressure sensor element, whereby said pressure sensor element as package-sealed has a recess at a portion occupied by said projection; and
(b-1-4) thereafter taking out said pressure sensor element now package-sealed from said metallic mold.

14. A method of claim 13, wherein, in said step (b-1-3), said molding resin is implanted into said cavity under such an implantation pressure that said diaphragm is not destroyed by the implantation pressure of said molding resin.

15. A method of claim 13, wherein said step (c) includes the step of:
(c-1) chemically removing said molding resin still remaining at a bottom of said recess and exposing said diaphragm.

16. A method of claim 15, wherein said step (c-1) includes the step of:
(c-1-1) dissolving and removing said molding resin still remaining at a bottom of said recess, thereby exposing said diaphragm.

17. A method of claim 16, wherein said step (c-1-1) includes the steps of:
dissolving said molding resin remaining at the bottom of said recess with a few drops of fuming nitride acid and exposing said diaphragm;
thereafter cleaning said diaphragm in water;
thereafter dehydrating said diaphragm; and
thereafter drying said diaphragm.

18. A method of claim 17, wherein said diaphragm is dehydrated using ethanol.

* * * * *